(12) United States Patent
Kent

(10) Patent No.: US 8,752,872 B2
(45) Date of Patent: Jun. 17, 2014

(54) EDGE GRIP END EFFECTOR

(75) Inventor: Richard J. Kent, Newbury, NH (US)

(73) Assignee: Fabworx Solutions, Inc., Austin, TX (US)

(*) Notice: Subject to any disclaimer, the term of this patent is extended or adjusted under 35 U.S.C. 154(b) by 794 days.

(21) Appl. No.: 12/878,139

(22) Filed: Sep. 9, 2010

(65) Prior Publication Data
US 2011/0064556 A1 Mar. 17, 2011

Related U.S. Application Data

(60) Provisional application No. 61/242,116, filed on Sep. 14, 2009.

(51) Int. Cl.
H01L 21/687 (2006.01)

(52) U.S. Cl.
USPC .............................. 294/90; 294/106; 414/941

(58) Field of Classification Search
CPC ............ H01L 21/687; H01L 21/68707; H01L 21/68728
USPC ...................... 414/941; 294/90, 106
See application file for complete search history.

(56) References Cited

U.S. PATENT DOCUMENTS

| | | | |
|---|---|---|---|
| 5,669,644 A * | 9/1997 | Kaihotsu et al. | 294/213 |
| 6,167,893 B1 * | 1/2001 | Taatjes et al. | 134/147 |
| 6,273,484 B1 | 8/2001 | Peng | |
| 6,558,562 B2 * | 5/2003 | Mallery et al. | 216/38 |
| 7,748,760 B2 * | 7/2010 | Kushida et al. | 294/213 |
| 2004/0219001 A1 | 11/2004 | Reimer et al. | |
| 2007/0022588 A1 | 2/2007 | Kent | |
| 2008/0110861 A1 * | 5/2008 | Kajita et al. | 216/83 |

FOREIGN PATENT DOCUMENTS

| | | |
|---|---|---|
| JP | 06-155213 | 3/1994 |
| JP | 2008-108991 | 5/2008 |

OTHER PUBLICATIONS

Search Report dated Nov. 3, 2010; 3 pages.
Toshikazu, K. et al.; "Work Holding Mechanism"; Patent Abstracts of Japan; JP Publication No. 2008-108991; Aug. 5, 2008; machine translation of reference; 18 pages.
Tomohiro, S. et al.; "Rotation Mechanism"; Patent Abstracts of Japan; JP Publication No. 06-155213; Mar. 6, 1994; 20 pages.

* cited by examiner

Primary Examiner — Saul Rodriguez
Assistant Examiner — Brendan Tighe
(74) Attorney, Agent, or Firm — John A. Fortkort; Fortkort & Houston P.C.

(57) ABSTRACT

An end effector blade (201) is provided which has a region (203) defined thereon for receiving an article. The end effector blade is also equipped with a plurality of tabs (213) disposed about the periphery of said region. Each tab moves from a first position when no article is present in the region, to a second position when an article is disposed in the region, and each tab pressingly engages the article when it is in the second position.

34 Claims, 9 Drawing Sheets

EDGE GRIP END EFFECTOR

CROSS-REFERENCE TO RELATED APPLICATION

This application claims the benefit of priority from U.S. Provisional Application No. 61/242,116 (Kent), filed 14 Sep. 2009, having the same title, and having the same inventor, and which is incorporated herein by reference in its entirety.

FIELD OF THE DISCLOSURE

The present disclosure relates generally to robots, and more particularly to robots equipped with a lever or other such means for securing an article on a surface of the robot while the article is transported from a first location to a second location.

BACKGROUND OF THE DISCLOSURE

The use of robots is widespread in the semiconductor industry, due to their ability to process a large number of semiconductor wafers through many different processing technologies, and to perform repetitive tasks quickly and accurately. The use of robots is especially advantageous in portions of semiconductor fabrication lines where human handling of semiconductor wafers is inefficient or undesirable. For example, many semiconductor fabrication processes, such as etching, deposition, and passivation, occur in reaction chambers having sealed environments. The use of robots allows these environments to be carefully maintained in order to minimize the likelihood of contamination and to optimize processing conditions.

Modern semiconductor processing systems include cluster tools that integrate a number of process chambers together in order to perform several sequential processing steps without removing the substrate from the highly controlled processing environment. These chambers may include, for example, degas chambers, substrate pre-conditioning chambers, cooldown chambers, transfer chambers, chemical vapor deposition chambers, physical vapor deposition chambers, and etch chambers. The combination of chambers in a cluster tool, as well as the operating conditions and parameters under which those chambers are run, are selected to fabricate specific structures using a specific process recipe and process flow.

Once the cluster tool has been set up with a desired set of chambers and auxiliary equipment for performing certain process steps, the cluster tool will typically process a large number of substrates by continuously passing them, one by one, through a series of chambers or process steps. The process recipes and sequences will typically be programmed into a microprocessor controller that will direct, control and monitor the processing of each substrate through the cluster tool. Once an entire cassette of wafers has been successfully processed through the cluster tool, the cassette may be passed to yet another cluster tool or stand alone tool, such as a chemical mechanical polisher, for further processing.

One example of a known fabrication system of the type described above is the cluster tool 101 disclosed in U.S. Pat. No. 6,222,337 (Kroeker et al.), and reproduced in FIGS. 1-2 herein. The magnetically coupled robots 103, 153 disclosed therein are equipped with upper 105 and lower 107 robotic arms having a frog-leg type construction that are adapted to provide both radial and rotational movement of the robot blade 109 within a fixed plane. The radial and rotational movements can be coordinated or combined to allow for pickup, transfer and delivery of substrates from one location within the cluster tool to another location. For example, the robotic arm may be used to move substrates from one processing chamber to an adjacent chamber.

FIG. 1 is a schematic diagram of the integrated cluster tool 101 of Kroeker et al. Wafers or other substrates 102 are introduced into, and withdrawn from, the cluster tool 101 through a cassette loadlock 111. A robot 103 having a blade 109 is located within a chamber 113 of the cluster tool 101 and is adapted to transfer the substrates from one process chamber to another. These process chambers may include, for example, a cassette loadlock 115, a degas wafer orientation chamber 117, a preclean chamber 119, a PVD TiN chamber 121 and a cooldown chamber 123. The robot blade 109 is illustrated in the retracted position in which it can rotate freely within the chamber 113.

A second robot 153 is located in transfer chamber 163, and is adapted to transfer substrates between various chambers which may include, for example, a cool-down chamber 165, a pre-clean chamber 167, a CVD Al chamber 169 and a PVD AlCu processing chamber 171. The specific configuration of chambers illustrated in FIG. 1 is designed to provide an integrated processing system capable of both CVD and PVD processes in a single cluster tool. A microprocessor controller 171 is provided to control the fabricating process sequence, conditions within the cluster tool, and the operation of the robots 103, 153.

Robots of the type depicted in FIGS. 1-2 above are utilized, for example, in the ENDURA® and CENTURA® 200 nm/300 nm platforms sold by Applied Materials (Santa Clara, Calif.). As seen in FIG. 2, these robots 103 include a central hub 131, a pair of upper arms 105, and a pair of lower arms 107. The lower arms 107 are rotatingly attached to the hub 131 and are driven by servo drives housed within the hub 103.

SUMMARY OF THE DISCLOSURE

In one aspect, a robot is provided which is adapted to transport an article from a first location to a second location. The robot comprises a surface having a region defined thereon for receiving the article, and at least one element which secures the article in the region by pivoting from a first position to a second position when the article is placed in the region.

In another aspect, a robot is provided which is adapted to transport an article from a first location to a second location. The robot comprises a surface having a region defined thereon for receiving the article, and at least one weight-activated element which moves from a first position to a second position when the article is placed in the region, and which moves from the second position to the first position when the article is removed from the region. The element pressingly engages the article when it is in the second position.

In yet another aspect, a robot is provided which is adapted to transport an article from a first location to a second location. The robot comprises a surface having a region defined thereon for receiving the article, and at least one element disposed about the periphery of said region. The element moves from a first position when no article is present in the region to a second position when an article is disposed in the region, and the tab pressingly engages the article when it is in the second position.

In still another aspect, a robotic arm is provided which comprises an end effector having a region defined thereon for receiving an article, and a plurality of tabs disposed about the periphery of said region. Each tab moves from a first position when no article is present in the region to a second position when an article is disposed in the region, and each tab pressingly engages the article when it is in the second position.

In a further aspect, a method for transporting an article from a first location to a second location is provided. The method comprises (a) providing a robot having a surface with a region defined thereon for receiving the article, and having at least one element which secures the article in the region by pivoting from a first position to a second position when the article is placed in the region; (b) placing the article in the region at the first location; and (c) transporting the article to the second location with the robot.

In another aspect, a method for transferring an article from a first location to a second location is provided. The method comprises (a) providing a robotic arm equipped with an end effector having a region defined thereon for receiving an article, wherein the end effector has at least one tab disposed about the periphery of said region which moves from a first position when no article is present in the region to a second position when an article is disposed in the region, and wherein the tab pressingly engages the article when it is in the second position; (b) placing the article on the region, thereby causing the first tab to move from the first position to the second position; and (c) transferring the article from the first location to the second location.

In still another aspect, a method for transferring an article from a first location to a second location is provided. The method comprises (a) providing a robotic arm equipped with an end effector having a region defined thereon for receiving the article, wherein the end effector has first and second sets of opposing tabs disposed about the periphery of said region, wherein each tab comprises a lever that pivots about a fulcrum as the tab moves from a first position to a second position, wherein the lever comprises a first end having a first protrusion thereon and a second end having a second protrusion thereon, and wherein the second protrusion comprises an elastomeric material; (b) placing an article on the region in the first location, thereby causing the first tab to move from the first position to the second position, wherein the first tab pressingly engages the article when the tab is in the second position; and (c) transferring the article from the first location to the second location.

In another aspect, an end effector is provided which comprises (a) a wafer blade having a region defined thereon for receiving a wafer; and (b) a plurality of weight-activated tabs disposed about the periphery of said region, wherein each tab moves from a first position when no wafer is present in the region to a second position when a wafer is disposed in the region, and wherein each tab pressingly engages the wafer when it is in the second position.

In a further aspect, a method is provided for transferring an article from a first location to a second location. In accordance with the method, a robotic arm is provided which is equipped with an end effector having a region defined thereon for receiving an article, wherein the end effector has at least one tab disposed about the periphery of said region which moves from a first position to a second position. The article is placed on the region, thereby causing the first tab to move from the first position to the second position, wherein the tab pressingly engages the article when the tab is in the second position. The article is then transferred from the first location to the second location.

BRIEF DESCRIPTION OF THE DRAWINGS

For a more complete understanding of the present disclosure and the advantages thereof, reference is now made to the following description taken in conjunction with the accompanying drawings in which like reference numerals indicate like features and wherein.

DETAILED DESCRIPTION

Figure 1:
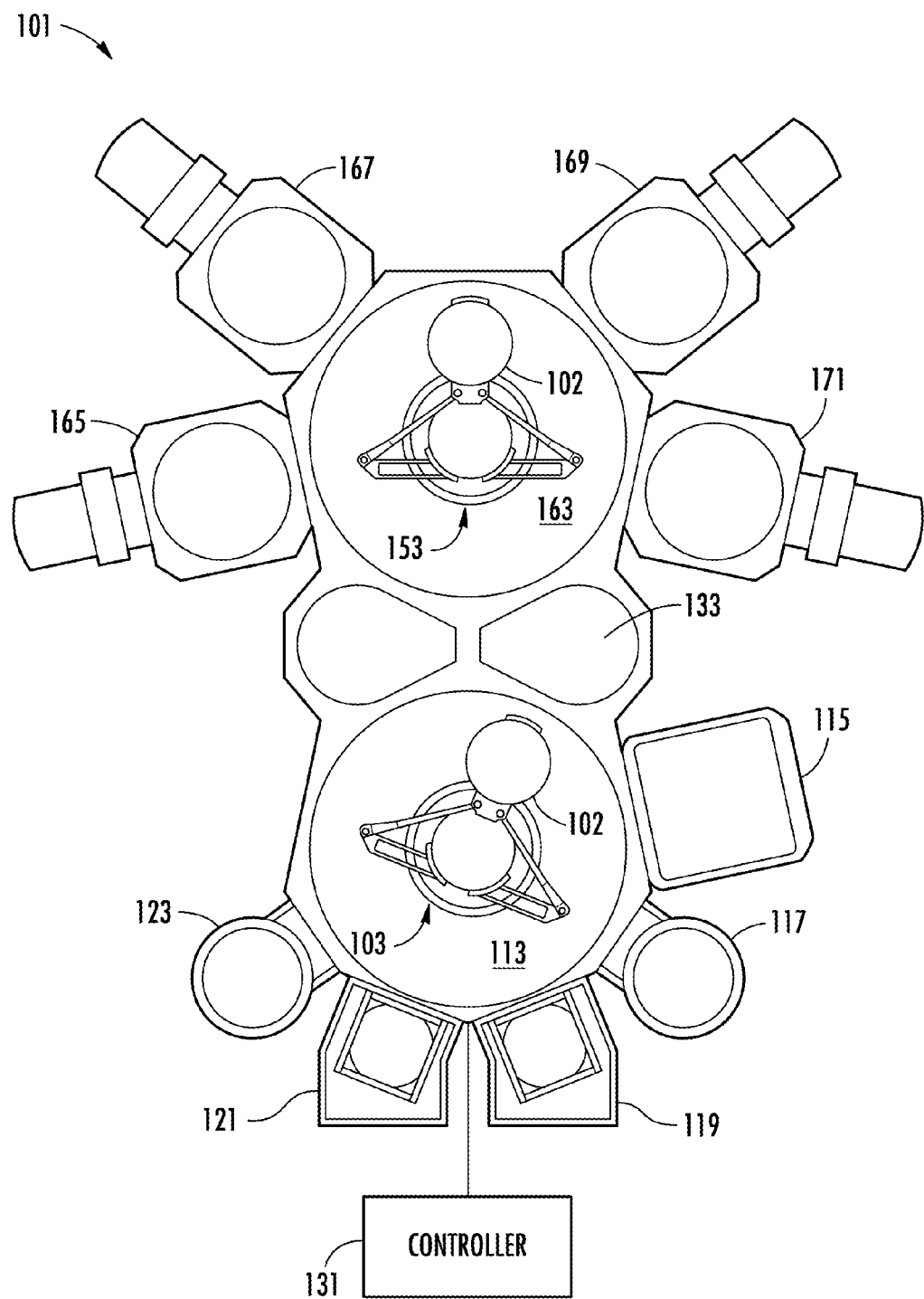
FIG. 1 is an illustration of a prior art cluster tool.
Figure 2:
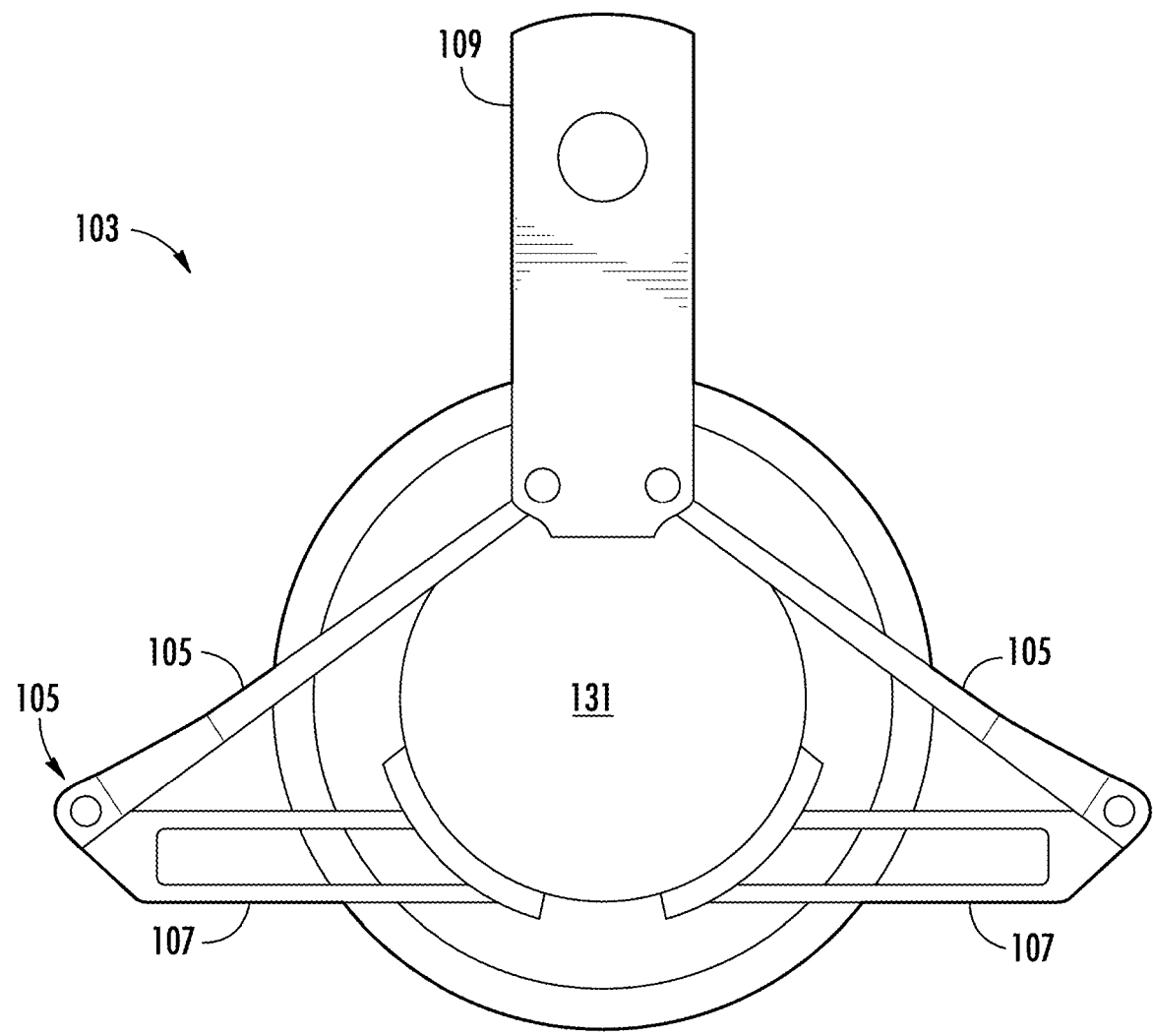
FIG. 2 is an illustration of a prior art robot.

While the robots depicted in FIGS. 1-2 have several advantageous features, they also suffer from some infirmities. In particular, as semiconductor processing speeds have increased, it has become increasingly difficult for robots of this type to maintain the semiconductor wafer in a proper position within the pocket of the wafer blade at all times. Instead, it has become increasingly common for wafers to move about in, or even fall out of, the wafer blade pocket. Such incidences can damage both the wafer and wafer processing equipment, and may necessitate downtime for the processing line. Larger wafers can exacerbate these problems, since they are prone to bowing across the wafer surface and thus do not sit flatly in some end effector blades. It will be appreciated from the foregoing that higher processing speeds can also exacerbate any errors in positioning the wafer properly on the end effector blade in the first place.

It has now been found that the foregoing problems may be addressed through the provision of a robot of the type described herein which is adapted to transport an article from a first location to a second location. The robot comprises a surface having a region defined thereon for receiving the article, and at least one lever or other element which secures the article in the region by moving or pivoting from a first position to a second position when the article is placed in the region. The lever or other element preferably presses against a surface, and more preferably presses against a side, of the article when it is in the second position, and thus serves to prevent the article from being dislodged from the region during transport. The lever or element preferably moves or pivots from the second position to the first position when the article is removed from the region, as may occur, for example, after the article has been transported to the second location.

In a preferred embodiment, the robot is adapted for use in semiconductor processing, and hence is equipped with a wafer holding means for preventing a wafer from moving inside of a wafer blade pocket while the robot is moving at higher speeds. The wafer holding means preferably comprises one or more levers, tabs or other elements which are disposed about the periphery of the wafer pocket or other region on which the wafer will be disposed. The elements are preferably weight-activated and move from a first position when no wafer is present in the wafer holding region to a second position when a wafer is disposed in the wafer holding region. When these elements are in the second position, they press against the sides of the wafer to maintain the wafer in position on the wafer blade.

Preferably, the elements are used in combination with a wafer blade pocket having a beveled sidewall, as this arrangement allows the wafer to be secured in the wafer pocket with only a small movement of the elements (e.g., a 1°-2° rotation in the case of a lever). The beveled sidewall also corrects for some error in the placement of the wafer in the wafer blade pocket. Advantageously, this arrangement does not require any contact with the top surface of the wafer and requires the application of minimal force in order for the wafer to be placed and secured in the wafer blade pocket.

The elements may also be equipped with soft, elastomeric surfaces, high temperature plastics, or ceramics in the areas where they contact the wafer to further prevent damage to the wafer. In addition, in the case of larger wafers, the wafer blade pocket may be provided with one or more elastomeric protrusions on the interior of the pocket to prevent wafer bowing or to help to ensure that the wafer is or remains firmly seated in the wafer blade pocket.

Of course, while the devices and methodologies disclosed herein will frequently be described herein in reference to their use in conjunction with semiconductor wafers, one skilled in the art will appreciate that these devices and methodologies are more generally applicable to the handling by robots of various types of articles of varying shapes, mass and physical dimensions. Moreover, these devices and methodologies are also applicable to a wide variety of robot types and components.

Figure 3:
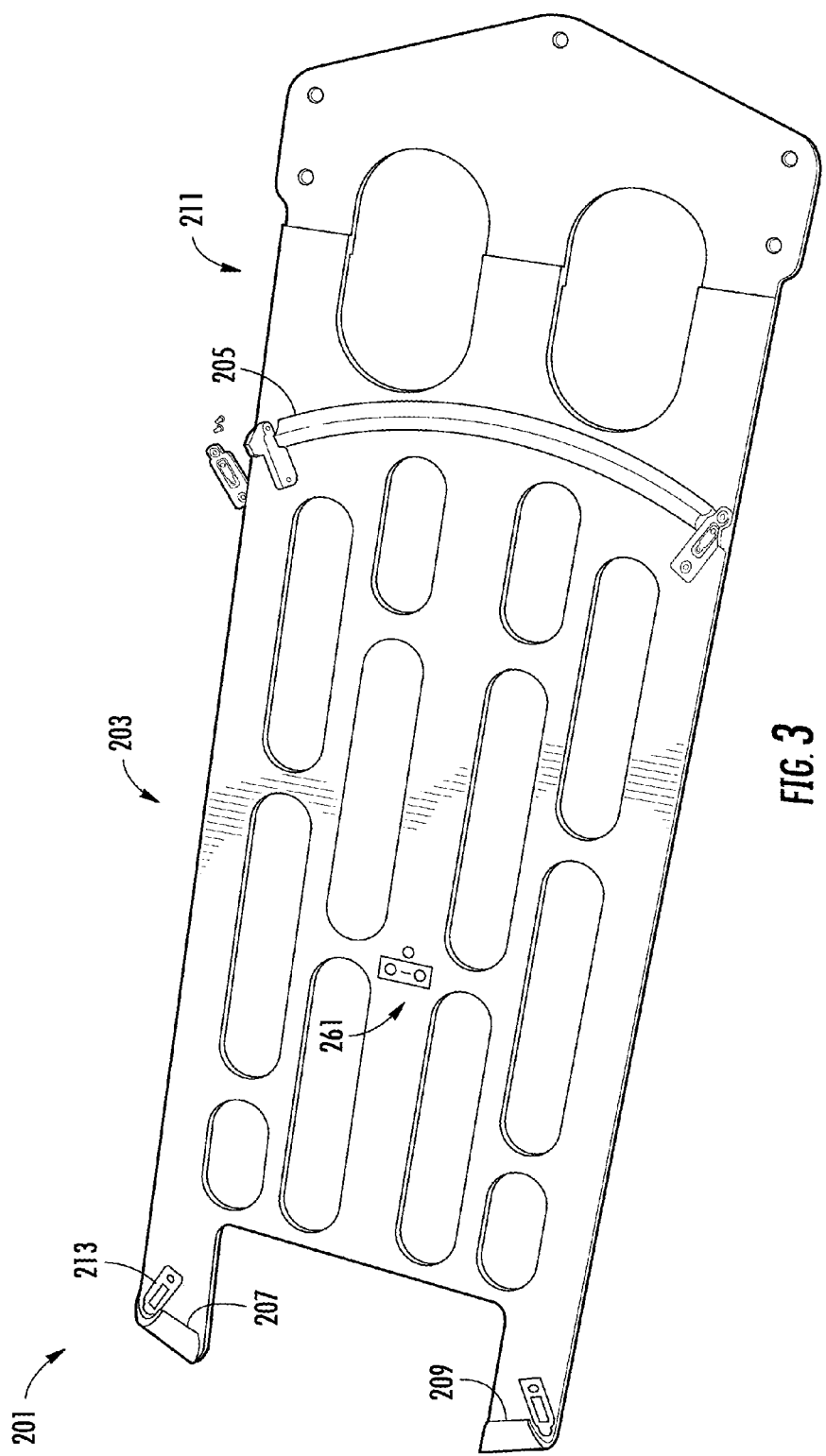
FIG. 3 is a perspective view of the top surface of a first particular, non-limiting embodiment of an end effector made in accordance with the teachings herein.
Figure 4:
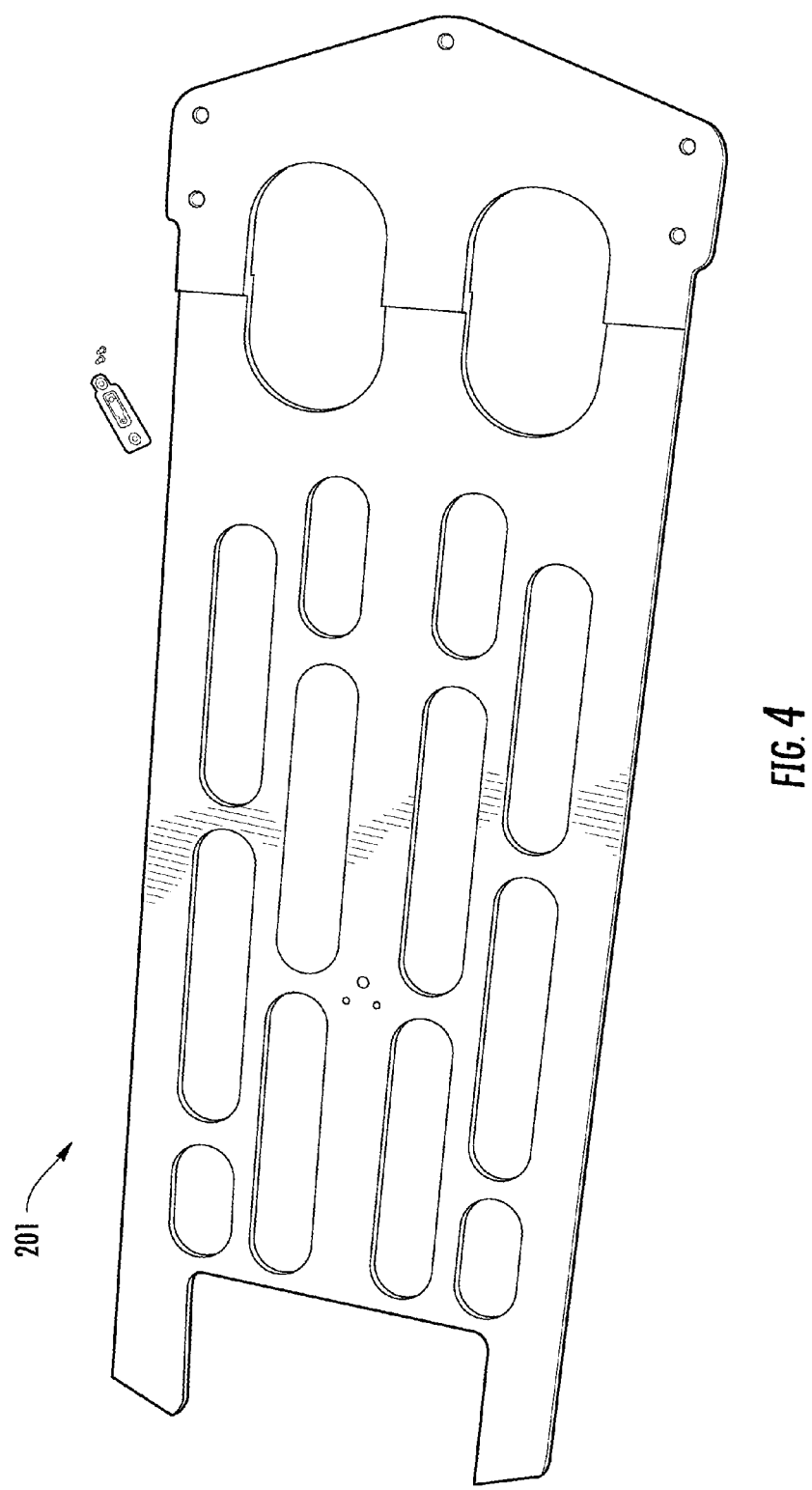
FIG. 4 is a perspective view of the bottom surface of the end effector of FIG. 3.

The devices and methodologies disclosed herein may be further understood with reference to the first particular, non-limiting embodiment, depicted in FIGS. 3-13, of an end effector blade made in accordance with the teachings herein. With reference to FIGS. 3-4, the end effector blade 201 comprises a first essentially planar region 203 (see FIG. 3) which is bounded by raised, beveled arcuate portions 205, 207 and 209, and a second region 211. The first region 203 has a plurality of tabs 213 disposed about the periphery thereof.

The second region 211 of the end effector blade attaches to the blade mount (not shown) of an end effector, which in turn is attached to a robotic wrist assembly (not shown). One particular, non-limiting example of such a blade mount is disclosed in commonly assigned U.S. Ser. No. 11/788,365 (Kent), filed on Apr. 18, 2007, and entitled "Adjustable Wrist Design for Robotic Arm" (see especially FIGS. 5-8 thereof), which is incorporated herein by reference in its entirety. Another particular, non-limiting example of such a blade mount is disclosed in commonly assigned U.S. Ser. No. 12/508,729 (Kent), filed on Jul. 24, 2009, and entitled "Edge Grip End Effector" (see especially FIGS. 11-12 thereof), which is incorporated herein by reference in its entirety.

Figure 5:
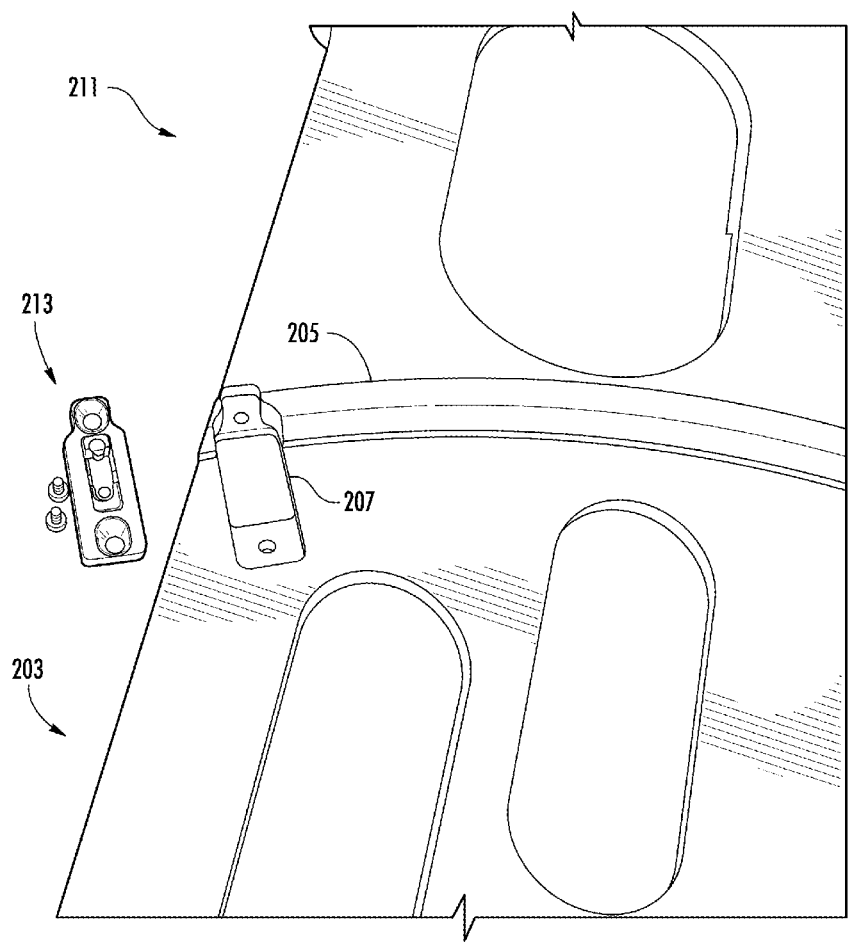
FIG. 5 is a magnified view of the end effector of FIG. 3 with one of the tabs removed.
Figure 6:
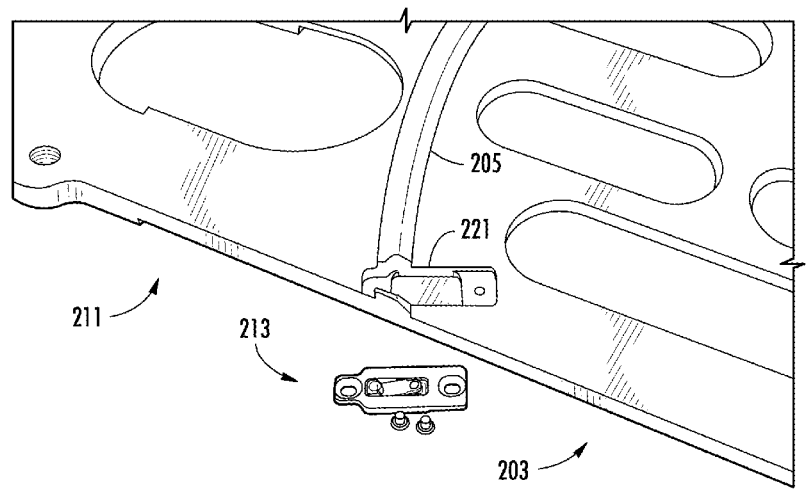
FIG. 6 is another magnified view of the end effector of FIG. 3 with one of the tabs removed.
Figure 7:
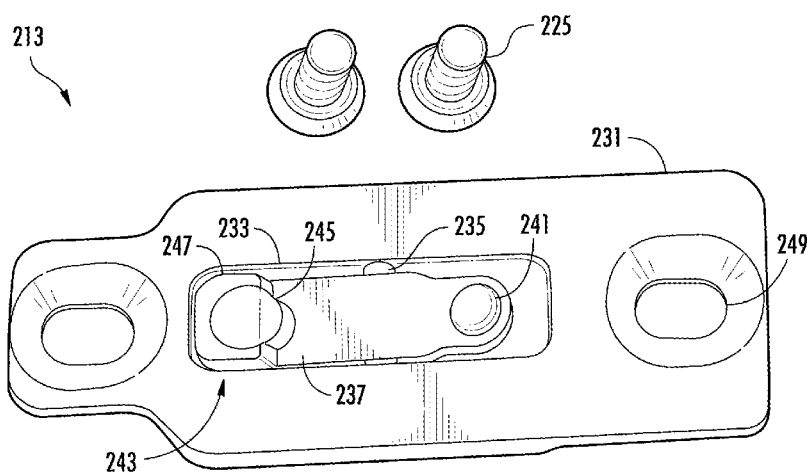
FIG. 7 is a perspective view of one of the tabs utilized in the end effector of FIG. 3.
Figure 8:
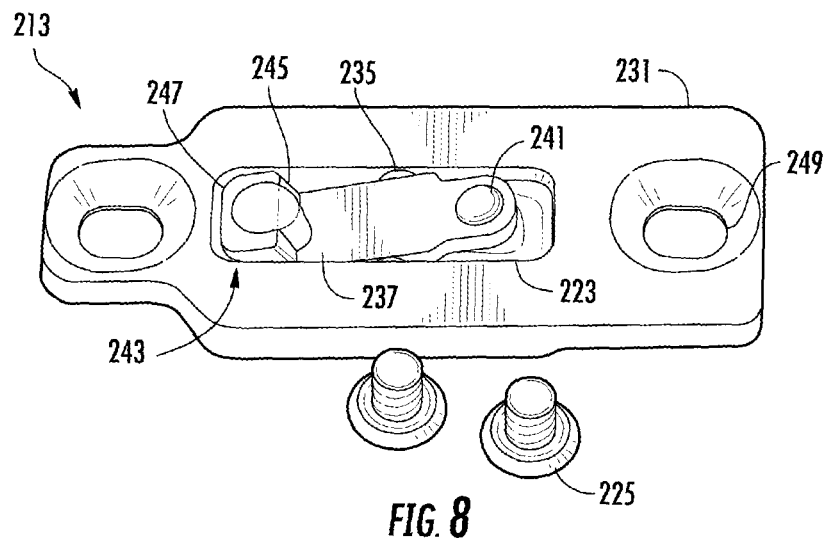
FIG. 8 is a perspective view of the top surface of one of the tabs utilized in the end effector of FIG. 3.
Figure 9:
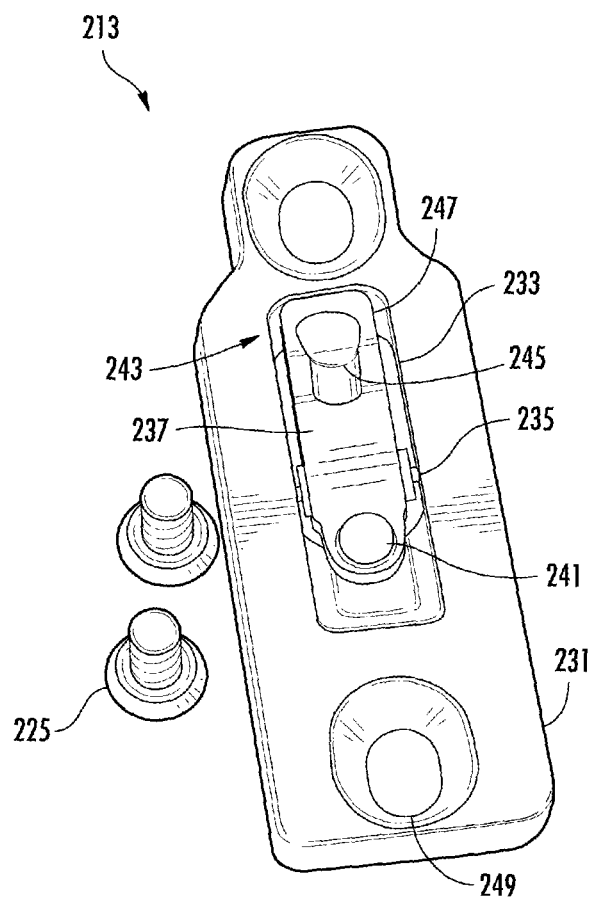
FIG. 9 is a perspective view of the top surface of one of the tabs utilized in the end effector of FIG. 3.
Figure 10:
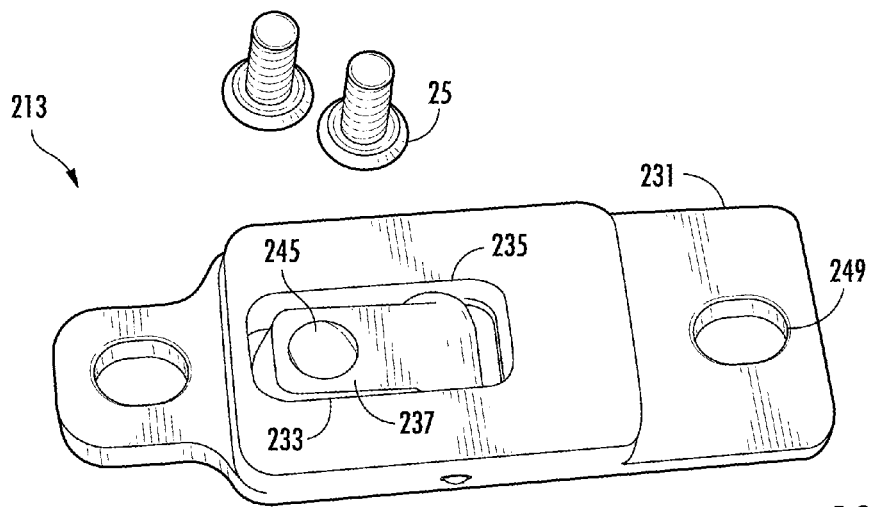
FIG. 10 is a perspective view of the bottom surface of one of the tabs utilized in the end effector of FIG. 3.

FIGS. 5-6 depict the manner in which the tabs 213 are incorporated into the end effector blade 201. As seen therein, a recess 221 is provided in the surface of the blade 201 for each tab 213 near the periphery of the region 203. The recess 221, which is complimentary in shape to the tab 213, is provided with a pair of threaded apertures 223 which are adapted to rotatingly engage a complimentary pair of threaded fasteners 225 to secure the tab 213 in place. The recess 221 is further provided with a sub-recess 227 which registers with the bottom surface of the tab (see FIG. 10) to ensure that the tab is seated in the proper orientation on the end effector blade 201.

FIGS. 7-10 depict the tab 213 in greater detail. As seen therein, in the particular embodiment depicted, the tab 213 comprises an outer body 231 having an interior chamber 233 with a fulcrum 235 and lever 237 disposed therein. The lever 237 is equipped with first 241 and second 243 protrusions disposed on first and second respective ends of the lever 237. The first protrusion 241 is rounded and, more preferably, is hemispherical. The second protrusion 243 comprises an elastomeric pad 245 which protrudes from the top and from one side of a partial enclosure 247.

Figure 12:
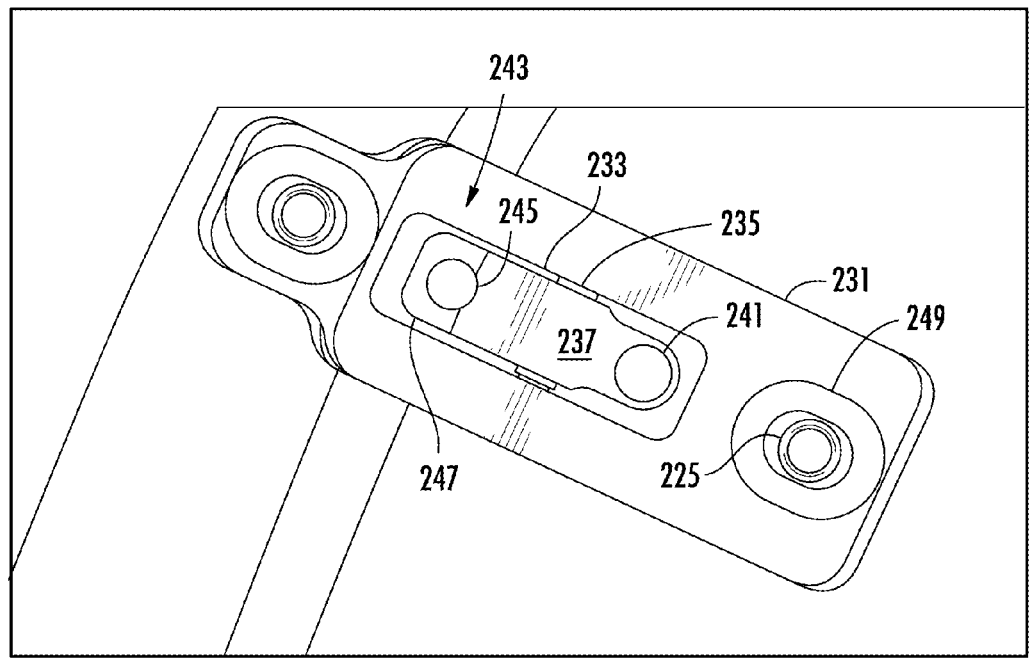
FIG. 12 is a perspective view of a tab which may be utilized in the end effectors disclosed herein.

The tab 213 is also equipped with a pair of apertures 249 through which fasteners 225 extend. The apertures 249 are elliptical, and the major axes of the ellipses are collinear. The fasteners are essentially circular in cross-section. As best seen in FIG. 12, this arrangement allows the position of the tab 213 to be adjusted slightly along a line passing through the major axes of the apertures 249.

Figure 13:
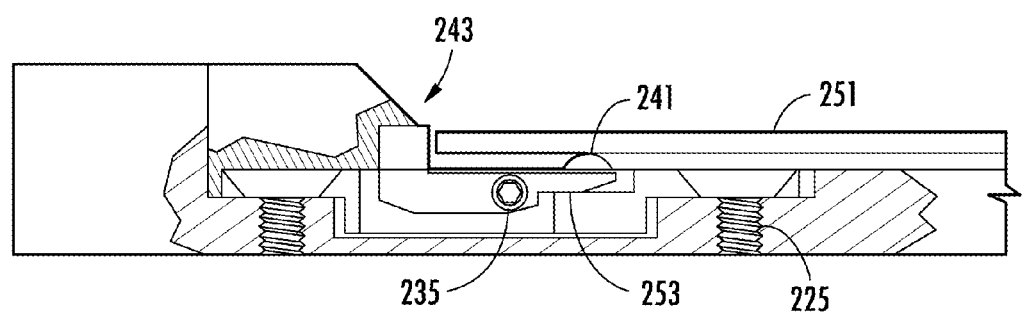
FIG. 13 is a view, partially in section, of a tab which may be utilized in the end effectors disclosed herein.

FIG. 13 shows the cross-sectional disposition of the tab 213 within the end effector blade 201 when an article 251, such as a semiconductor wafer, is placed upon the end effector blade 201. As seen therein, the article 251 presses down upon the first protrusion 241, thus causing the lever 237 to pivot about the fulcrum 235. This, in turn, causes the elastomeric pad 245 to press against the side of the article 251. The use of raised, beveled (see FIG. 3) in combination with the levers 237, and the positioning of the levers 237 within the arcuate portions 205, 207 and 209, is especially advantageous, since only a small movement of the lever (e.g., a rotation of about 1° to 2°) is required to capture the wafer with this arrangement.

In the particular embodiment depicted, a rotation stop 253 is provided which arrests the downward motion of the lever 237. The rotation stop 253 has an angular stop (measured by the angle of intersection between the angle of rotation and the surface of the stop) which is preferably within the range of about 80° to about 100°, more preferably within the range of about 85° to about 95°, and most preferably is about 90°.

Figure 11:
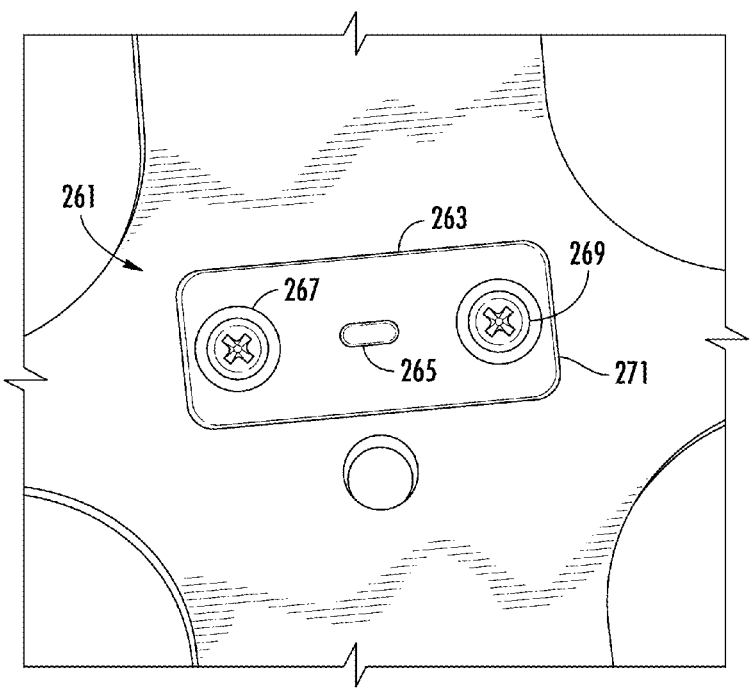
FIG. 11 is a magnified view of the center tab of FIG. 3.

FIG. 11 shows tab 261 of FIG. 3 in greater detail. As seen therein, tab 261 comprises an essentially rectangular body 263 set in a recess 271 formed in the first region 203 of the end effector blade 201. The tab 261 is equipped with an elastomeric pad 265 disposed in the center thereof, and is attached to end effector blade 201 with a set of fasteners 269 that extend through corresponding apertures 267. In use, the elastomeric pad 265 serves to support the center of a wafer above the surface of the end effector blade 201. It will be appreciated, however, that tab 261 is not necessary in some embodiments of end effectors made in accordance with the teachings herein, while in other embodiments, multiple tabs of this type may be employed.

Various modifications may be made to the devices and methodologies disclosed herein. For example, the tabs and the components thereof which are disclosed herein may be made in various shapes and dimensions, and may be used in conjunction with various types of end effectors and end effector blades. Moreover, while such end effectors will preferably have one or more planar surfaces, the tabs disclosed herein may be used in conjunction with non-planar surfaces as well.

In addition, while the devices and methodologies disclosed herein have frequently been described and illustrated with respect to their use in conjunction with semiconductor wafers and in semiconductor processing, one skilled in the art will appreciate that these devices and methodologies are more generally applicable to the handling of various types of articles, including both semiconductor and non-semiconductor articles. Such articles may be of varying shapes, mass and physical dimensions and include, without limitation, flat panel displays, solar arrays, optoelectronic devices, and various components of various other devices. Moreover, the devices and methodologies disclosed herein are also applicable to a wide variety of robots and robotic components. It will also be appreciated that the geometry and number of the tabs and the geometry of the end effector may be modified to accommodate the product in question.

In the embodiment depicted in FIGS. 3-13, beveled arcuate portions 205, 207 and 209 are utilized to facilitate placement of an article (a semiconductor wafer) in a region (first region 203). However, various other means may be utilized to a similar end in the devices and methodologies disclosed herein. For example, various types of electrically or pneumatically driven members or devices may be provided to pull, push or suck an article into place so that it is properly seated in the region adapted to receive it. Such means may also be provided to aid in the retention of the article in the region during transport.

By way of illustration, if one or more levers or tabs are provided to retain the article in the region, various electrically or pneumatically driven locking or latching mechanisms may be provided which lock the levers or tabs in place after the article has been placed in the region. In the case of a wafer disposed on a wafer blade, for example, such a locking or latching mechanism may allow the wafer to subsequently be disposed in a substantially vertical orientation after it is seated on the wafer blade, an ability which may facilitate various types of processing or enable new types of processing.

Such a latching or locking mechanism may be configured to be activated in response to the application of a force, in response to movement of the robot or a part thereof, on demand, or at other times as may be appropriate during a given process. For example, the latching or locking mechanism may be activated by an accelerometer, which may be disposed in the vicinity of the article. The latching or locking mechanism, or in some embodiments the tab or lever itself, may also comprise piezoelectric materials such as, for example, piezoceramics, which allow the device to be moved or activated through the application of a current or voltage. In other embodiments, the lever or tab may be spring-loaded or pneumatically loaded so that it assumes a desired orientation. The desired orientation may be assumed when no article is placed in the region, or while an article is placed in the region.

In addition, while the devices and methodologies disclosed herein have frequently been described and illustrated with respect to their use in conjunction with robots, one skilled in the art will appreciate that these devices and methodologies may be advantageously employed in a variety of other tools and devices. For example, the tabs disclosed herein may be employed in heater chucks in a semiconductor process module, in carriages for use in transporting goods, or in pallets designed for use in an assembly line or conveyor system.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A robotic arm, comprising:
   an end effector having a region defined thereon for receiving an article;
   a beveled, arcuate wall which is disposed along a portion of the periphery of said region and which slopes away from said region in a direction going from the bottom of said wall to the top of said wall; and
   a plurality of tabs disposed about the periphery of said region, wherein each tab moves from a first position when no article is present in the region to a second position when an article is disposed in the region, and wherein each tab pressingly engages the article when it is in the second position;
   wherein each tab comprises a lever which is pivotably connected to an outer body by way of a fulcrum and which pivots about said fulcrum as the tab moves from the first position to the second position, and wherein said outer body is removably connected to said end effector; and
   wherein the lever comprises a first end having a first protrusion thereon, and a second end having a second protrusion thereon, and wherein the first protrusion extends into the region when the tab is in the first position.

2. The robotic arm of claim 1, wherein said second protrusion comprises an elastomeric material.

3. The robotic arm of claim 1, wherein said first protrusion is hemispherical in shape.

4. In combination with the robotic arm of claim 1, a semiconductor wafer, wherein said semiconductor wafer is disposed in said region.

5. The robotic arm of claim 1, wherein said end effector comprises a blade having said region defined thereon.

6. A method for transferring an article from a first location to a second location, comprising:
   providing a robotic arm equipped with an end effector having a region defined thereon for receiving an article, wherein the end effector is equipped with a beveled, arcuate wall which is disposed along a portion of the periphery of said region and which slopes away from said region in a direction going from the bottom of said wall to the top of said wall, and wherein the end effector is further equipped with at least one tab disposed about the periphery of said region which moves from a first position when no article is present in the region to a second position when an article is disposed in the region, wherein the tab pressingly engages the article when it is in the second position, wherein each tab comprises a lever which is pivotably connected to an outer body by way of a fulcrum and which pivots about said fulcrum as the tab moves from the first position to the second position, and wherein said outer body is removably connected to said end effector;
   placing the article on the region, thereby causing the first tab to move from the first position to the second position; and
   transferring the article from the first location to the second location.

7. The method of claim 6, wherein the tab is moved from the second position to the first position when the article is in the second location.

8. The method of claim 7, wherein the tab is moved from the second position to the first position by lifting the article from the region.

9. The method of claim 7, wherein the tab moves from the second position to the first position when the article is lifted from the region.

10. The method of claim 6, wherein the tab is moved from the second position to the first position when the article is in the second location.

11. The method of claim 6, wherein the tab is withdrawn from the region when it is in the first position, and extends into the region when it is in the second position.

12. The method of claim 6, wherein the tab comprises a lever that pivots about a fulcrum as the tab moves from the first position to the second position.

13. The method of claim 12, wherein the lever comprises a first end having a first protrusion thereon, and a second end having a second protrusion thereon.

14. The method of claim 13, wherein the first protrusion is a rounded bump.

15. The method of claim 13, wherein the second protrusion comprises an elastomeric material.

16. The method of claim 15, wherein the elastomeric material is encased in a metal housing which is open on one side.

17. The method of claim 15, wherein elastomeric material protrudes from the open side of the metal housing.

18. The method of claim 13, wherein the first protrusion extends into the region when the tab is in the first position.

19. The method of claim 13, wherein the second protrusion extends into the region when the tab is in the second position.

20. The method of claim 13, wherein the first protrusion extends into the region when the first tab is in the first position, and wherein the second protrusion extends into the region when the tab is in the second position.

21. The method of claim 20, wherein placement of the article in the region depresses the first protrusion, thereby causing the lever to pivot about the fulcrum such that the second protrusion comes into contact with the article.

22. The method of claim 13, wherein said tab is disposed in a recess on the surface of the end effector.

23. The method of claim 22, wherein said first protrusion extends out of the recess when the tab is in the first position.

24. The method of claim 22, wherein said second protrusion extends out of the recess when the tab is in the second position.

25. The method of claim 6, wherein the first and second locations are first and second processing chambers.

26. The method of claim 15, wherein the first and second processing chambers are disposed in a semiconductor tool.

27. The method of claim 6, wherein the article is a semiconductor wafer.

28. The method of claim 6, wherein the at least one tab includes first and second tabs.

29. The method of claim 6, wherein the end effector comprises a blade, and wherein said region is a recessed portion disposed on said blade.

30. The method of claim 29, wherein said region is essentially planar.

31. A method for transferring an article from a first location to a second location, comprising:
providing a robotic arm equipped with an end effector having a region defined thereon for receiving the article, wherein the end effector is equipped with a beveled, arcuate wall which is disposed along a portion of the periphery of said region and which slopes away from said region in a direction going from the bottom of said wall to the top of said wall and wherein the end effector is further equipped with first and second sets of opposing tabs disposed about the periphery of said region, wherein each tab in said first and second sets of tabs comprises a lever which is pivotably connected to an outer body by way of a fulcrum and which pivots about said fulcrum as the tab moves from the first position to the second position, wherein said outer body is removably connected to said end effector, and wherein said lever comprises a first end having a first protrusion thereon and a second end having a second protrusion thereon;
placing an article on the region in the first location, thereby causing the first tab to move from the first position to the second position, wherein the first tab pressingly engages the article when the tab is in the second position; and
transferring the article from the first location to the second location.

32. The method of claim 31, wherein the second protrusion comprises an elastomeric material.

33. The robotic arm of claim 2, wherein said elastomeric material is disposed in a shoe.

34. The robotic arm of claim 33, wherein said shoe is a raised, U-shaped region on said lever.

* * * * *